March 7, 1961 C. M. AKINS 2,974,263

HEAT SINK AND DIODE ASSEMBLY

Filed Jan. 6, 1958

INVENTOR.

CLIFFORD M. AKINS

BY

Carlson & Hagle

ATTORNEYS

United States Patent Office 2,974,263 Patented Mar. 7, 1961

2,974,263

HEAT SINK AND DIODE ASSEMBLY

Clifford M. Akins, Minneapolis, Minn., assignor, by mesne assignments, to Marquette Corporation, Minneapolis, Minn., a corporation of Delaware Filed Jan. 6, 1958, Ser. No. 707,220

11 Claims. (Cl. 317—234)

My invention relates generally to improvements in diode rectifiers for converting alternating current potential to direct current, and more specifically to a heat sink and mounting for diode rectifiers of the rather recently introduced silicon type and which are rapidly replacing the older selenium rectifier units used for so many years and in so many applications.

To those skilled in the art little is necessary herein by way of comparison between the silicon and selenium rectifier cells or units. It is believed sufficient to state that the silicon diodes, which as now made include a silicon wafer sealed in a small metallic case, with contacts to this case and to a flexible lead extending outward from the interior of the case through an insulator and with the entire unit hermetically sealed, are so much smaller for a given current carrying capacity as to bear little comparison with the older selenium units. In addition the silicon diodes have a longer life, are relatively unaffected by shock, vibration or corrosive fumes in the air about them and offer the designer space saving and stacking possibilities never possible heretofore. Of materially to my invention, however, is the fact that the presently available silicon diodes designed for carrying relatively heavy currents, even though they will stand up well during operation at high ambient temperatures, do offer some problems in the dissipation of the heat developed during operation with heavy currents flowing and also require a mounting which will ensure proper mechanical support in and electrical contact with the heat sink constituted by the necessary metallic mounts for the cells. The heat sink is of particular importance since temperature rise in the cell is the primary limiting factor in its current carrying capacity.

My present invention is primarily concerned with full wave rectification, using a pair of the silicon diodes of relatively heavy current carrying capacity, in conjunction with an improved heat sink and supporting or mounting assembly, and while I have invented this combination particularly for use in battery chargers I do not, of course, limit myself at all to such applications alone. It is the primary object of my invention to provide a simple and compact heat sink and diode assembly for an application such as a battery charger and with provision not only for the proper removable and mechanical support and mounting of the diodes themselves along with the necessary extremely firm low resistance electrical contact to the sink, but with the components going to make up the sink so shaped that they will efficiently, equally carry off the heat developed during operation of the diodes, in opposite directions from each and through elements so shaped that large areas of heat radiating surfaces are formed over which cooling air from a fan, if such is used, may pass in efficient heat wiping relation; all in an assembly which is itself compact in order thus to utilize this virtue of the silicon type of cells, and which assembly lends itself to convenient support and mounting in the charger. Since the heat sink is electrically hot, as the expression goes, it is supported from the frame of the charger by simple electrical insulators all as will be presently set forth.

These and other more detailed and specific objects will be disclosed in the course of the following specification, reference being had to the accompanying drawings, in which—

Figure 1:
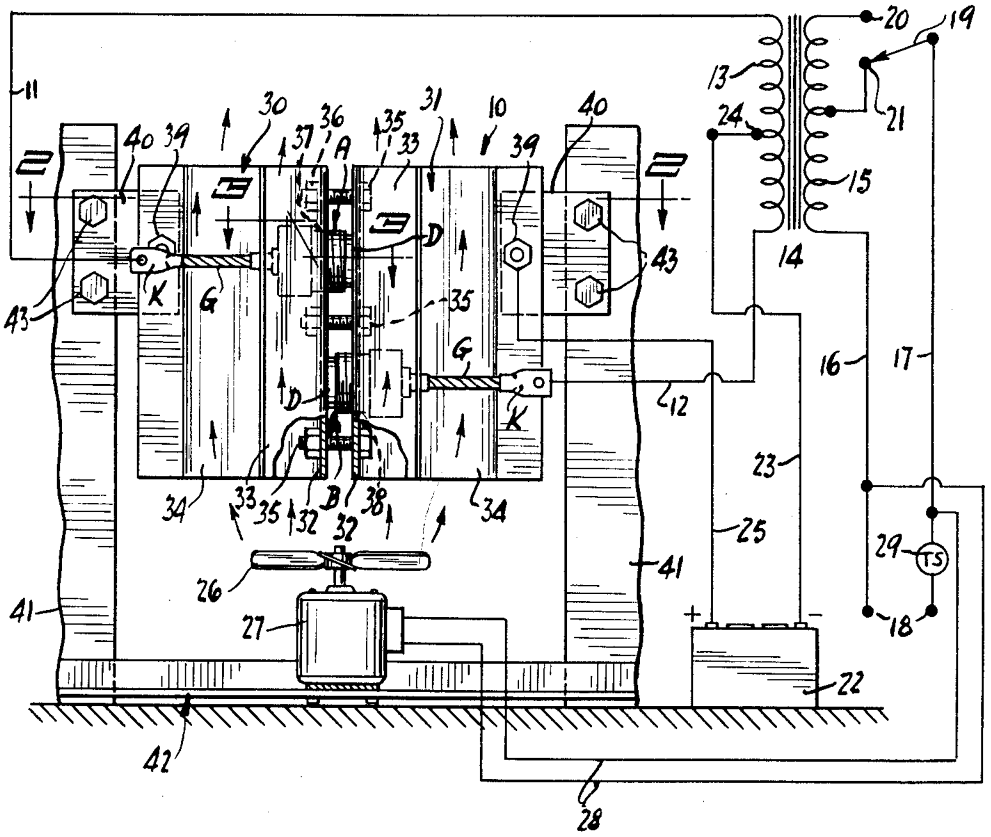
Fig. 1 is an elevational view of the heat sink and diode assembly of my invention, shown as mounted in suitable supporting brackets forming part of a battery charger, and with a schematic showing of the connections of the diodes in a single phase full wave rectifier circuit, with center tapped transformers, for storage battery charging.
Figures 2, 3, 4:
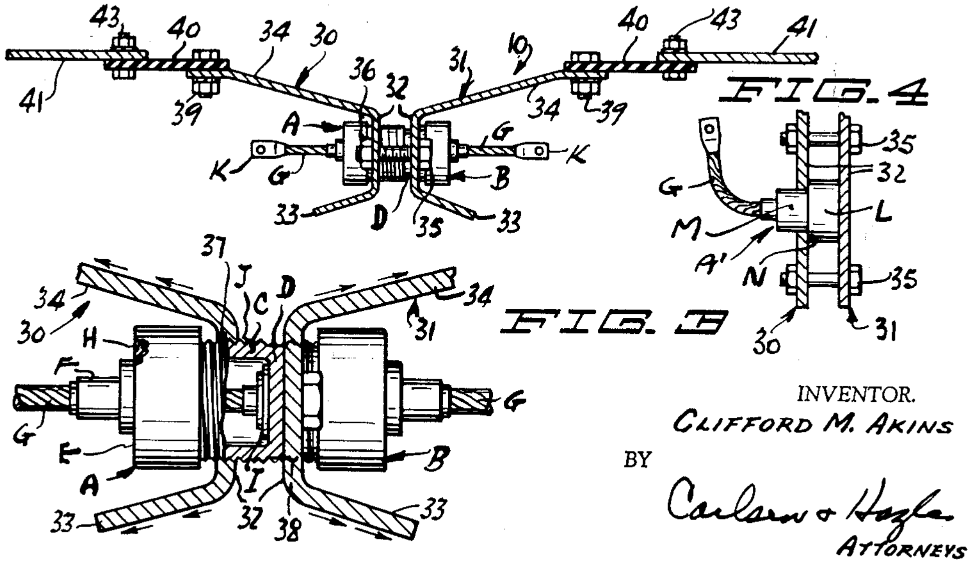
Fig. 2 is an enlarged horizontal sectional view taken substantially along the line 2—2 in Fig. 1.
Fig. 3 is a still further enlarged, fragmentary sectional detail view taken substantially along line 3—3 in Fig. 1.
Fig. 4 is a fragmentary detail sectional view showing a slightly modified form of diode.

Referring now more particularly and by reference characters to the drawings there appears therein a pair of conventional silicon diodes A and B and in explaining my invention it will be useful first to describe these diodes or cells and the circuit in which they are employed. The diodes are identical and as best seen in Fig. 3 each consists of a metal cylindrical cup-like case C closed at one exteriorly flat end D, with the case open at the opposite end E to receive a center terminal F through which passes a flexible conductor or pigtail lead G, the latter two components being insulated from the case itself and the entire unit hermetically sealed by means of an end seal of glass or the like, a fragment of which appears at H. Conductor G within the case C and immediately adjacent the closed end D thereof is electrically connected to one side of a wafer element I of silicon the other side of which is also electrically connected to the end D. Externally the case C is threaded at J and the end portion opposite closed end D is diametrically enlarged as clearly indicated. Each conductor G has a connector tab K (Figs. 1 and 2) and in this description it will be understood that this conductor will be regarded as the anode and the case C the cathode of the rectifier cell or unit.

In accordance with my invention the diodes A and B are supported in and their cases C both electrically connected to a heat sink and mounting designated generally at 10, said heat sink being of some such metal as aluminum which radiates heat well and is a good conductor of electricity. As seen in Fig. 1 the diodes A and B are connected by conductors 11 and 12 to the end terminals of the secondary 13 of a center tapped transformer 14 and the primary 15 of this transformer is connected by conductors 16 and 17 to terminals 18 leading to any commercially available source of alternating current potential. As here shown the conductor 17 is connected through a selector switch 19 to a pair of terminals 20 and 21 connected to different points on the transformer's primary winding 15 so that the output voltage of the transformer may be controlled, this being necessary where batteries of different voltages are to be charged as is well known in the art. A battery for charging is designated at 22 and a conductor 23 leads from the center tap 24 of the transformer secondary 13 to the negative terminal of the battery, whereas a conductor 25 from the positive battery terminal is connected as will be later described to the heat sink 10 and thus to the common or cathode terminals of the diodes A and B. It will, of course, be understood that the conductors 23—25 are provided with conventional clip-on connectors or clamps (not shown) for making connections to the respective negative and positive terminals of the battery 22 and it will further be obvious that the circuit thus shown and described constitutes the usual single phase full wave rectifier circuit, with the center tapped step down transformer, so that the alternating current potential impressed across the primary of the transformer will be reduced in voltage and rectified for proper charging of the battery. While here describing the circuit components it will be noted that in Fig. 1 I have shown a fan 26 located below the heat sink 10 and operated by an electric motor 27 connected by conductors 28 across the aforesaid conductors 16—17 so that this motor will be powered from the source 18. The fan and motor may, of course, be arranged either above or below the heat sink 10 (or it may be omitted entirely if not required) and it is to be noted that while I here refer to locations as above and below the heat sink the entire heat sink and diode assembly may if desired be located in a horizontal or any other plane than the vertical if this works out best in a particular machine or apparatus with which the assembly is used. Such modifications are to be regarded as within the scope of my invention. The circuit seen in Fig. 1 also includes a conventional timing switch 29 located in the conductor 17 and which may be adjusted to supply operating potential to the transformer 14 as well as to the fan motor 27 for any predetermined length of time.

It will be noted from the foregoing that the diodes A and B must in some fashion be firmly yet removably mounted upon the heat sink 10 and that the mounting be such that low resistance contacts will be made between the respective cathodes and the metallic elements going to make up the heat sink so that little or no electrical losses will occur in the mounting itself. As has been stated hereinbefore these diodes, where they operate at relatively heavy currents, do have a tendency to heat up, as is to be expected, and while the silicon type of units will not suffer damage from any reasonable degree of overheating, it is expedient to provide for the maximum and equal heat dissipation in the heat sink 10 from both diodes. Furthermore this heat sink, if the maximum benefits of the compactness of these silicon diodes for given current carrying capacities are to be realized, must itself be compact in order to offer the designer an opportunity to not only effect savings in space as compared to selenium rectifiers as an example, but also the heat sink must be capable of being conveniently mounted in whatever type of apparatus the rectifier is used, whether it be a battery charger or anything else where conversion of alternating current potentials to direct current potentials is required. It is also necessary that provision be made for the convenient replacement of the diodes should this become necessary and it is for this purpose that the cases C of the diodes here shown are externally threaded as designated at J in Fig. 3 and as earlier described.

In accordance with my invention the heat sink 10 is made up of identical sections in the form of a pair of channel-shaped elements or carriers, designated generally at 30 and 31, each of which as viewed from above is substantially U-shaped having a central bight or cathode carrying portion or web 32 from the edges of which extend diverging flanges or radiating elements 33 and 34. These channels 30—31 as they will hereinafter be referred to for the sake of simplicity are arranged with their webs 32 opposing each other and tied together by three tie or clamp bolts denoted collectively at 35 and equally spaced apart vertically as is best seen in Fig. 1. The bolts 35 are, of course, fitted with nuts 36 and in the spaces between adjacent pairs of the bolts one web 32 is provided with an upper tapped opening 37 whereas the opposite web is formed with a corresponding lower tapped opening 38. The arrangement is thus such that the diodes A and B may be screwed respectively into the upper and lower tapped openings 37 and 38 from opposite directions so that the closed ends D of the cases C of the diodes come to rest flatly agінst the facing surfaces of the opposing webs 32. The proper location of the diodes in opposite directions and axially with respect to each other, and the consequent drawing of all of the bolts 35 tight will thus bring the closed ends D of the diode cases into forceful flat and low resistance contact with the facing surfaces of the webs 32 of the channels 30—31, but it will be readily possible at any time to remove either of the diodes simply by the application of a tool (not shown) to the enlarged outer end of the diode where it lies between the flanges 33 and 34, as will also be apparent.

It is to be noted that the channels 30—31 are identical and interchangeable and it is for this reason largely that the diodes A and B are screwed into the heat sink from opposite directions. In addition, however, this opposite positioning of the diodes extends the pigtail-like conductor G in opposite directions so that they will not come into contact with each other.

The outer edge portions of the flanges 34 of the channels 30—31 are each bent slightly to lie in the same plane and they are secured each by a bolt 39 to an insulating support 40 in the form of a rectilinear block or sheet of "Fiberglas" or other similar material which acts both as an electrical insulator and as a mechanically stable means by which the heat sink 10 may be supported as an example between adjacent brackets 41 rising from a base portion 42 of the frame or chassis of the battery charger or other apparatus with which the rectifier is associated. The other ends of these insulating supports 40 are secured by bolts 43 or other suitable means to said brackets 41 and thus the heat sink 10 and its associated diode assembly are both firmly supported in or on the apparatus but electrically insulated therefrom as is required. In the embodiment seen in Fig. 1 the heat sink 10 is elevated above the base 42 to which the fan motor 27 is also secured so that air currents blown upwardly from the fan, as designated by the arrows, will be directed in wiping relationship over all surfaces of the heat sink and diodes. Also as seen in Fig. 1 the conductor 25, by which connection to the load as represented by the battery 22 to be charged is made, is fastened to one of the bolts 39 thus making electrical connection to the heat sink 10 and the common terminals of the diodes A and B. Obviously this relative location of the heat sink, brackets, fan, etc., is for example only and I do not in any sense restrict myself thereto.

In practice the maximum heat is generated in each diode A and B in the immediate proximity of the silicon wafer or element I and thus is brought to bear, so to speak, as a hot spot where the oppositely directed closed cathode ends D of these diodes bear against the opposed but facing surfaces of the channel webs 32. This heat is carried away and radiated in opposite directions from the "hot" end of each diode through the diverging flanges 33—34 of the two channels 30—31 going to make up the heat sink, as is indicated by the arrows in Fig. 3, and the mounting of the diodes A and B in opposite directions into and through the respective webs brings about a very effective heat dissipation through the metal away from both diodes and into the ambient atmosphere. In addition, however, the threads J form annular shoulder-like surfaces of substantial aggregate areas which bear very tightly upon the threads in the webs 32, opposite the diode ends D, because of the fact that the bolts 35 are pulled tight, and since the diode cases are of copper or other very good heat conductor much of the heat generated in the vicinity of the silicon wafers I is directed through these threads to the channels opposite those engaged by the flat ends D. As a matter of fact I find that heat dissipation from each diode is substantially equally distributed between the two channels. Use of aluminum or other metals known for their ability to conduct heat will, of course, contribute to this result and tests have proven this channel-like or radiating configuration of the two main sections going to make up the heat sink to be very effective. Where the fan 26 is used it directs cooling air in wiping, heat exchanging relation over the channels 30—31 as seen by the arrows in Fig. 1, over all surfaces of the webs 32 and flanges 33—34 thereof, and obviously will assist greatly in cooling the diode assembly.

The flanges 33, as shown, are relatively narrow as compared to the other flanges 34 to permit readier access to the diodes for their removal and replacement whenever required. It is to be noted also that the heat sink is made up of two sections or channels 30—31 which are clamped or pulled together by the bolts 35, these being so arranged that the heat sink sections may be forcefully brought into proper and precise alignment one with respect to the other and the diodes effectively locked in place against loosening by any reasonable vibration. Furthermore the diodes A and B are axially adjustable in opposite directions into these sections and are themselves relatively movable so that their closed "hot" ends D may be brought flatly to bear in proper mechanical and effective electrical engagement with the facing surfaces of the sections. This arrangement also provides for a considerable range of adjustment of the heat sink sections to accommodate diodes of differing lengths should this be required.

In connection with the latter feature of the heat sink it will be seen in Fig. 4 that the adjustability as between the channels 30—31 provided by the bolts 35 so that the webs 32 may be pulled tightly together at any relative spacing adapts the heat sink to use with shouldered rather than the threaded diodes one of which is designated generally at A'. Such diodes have a large diameter end L containing the wafer and a smaller diameter end M extending through the web opening as seen, and from which the conductor G extends as previously set forth. This configuration of the diode case forms an annular shoulder N which will be brought tightly to bear on the inside of one web 32 while the closed or cathode end of the case bears against the facing surface of the opposite web. Thus again there is the necessary firm metal-to-metal contact for the heat dissipation from the diodes oppositely out through both channels of the heat sink. In this view only a single diode is shown and only a fragment of the heat sink.

It is understood that suitable modifications may be made in the structure as disclosed, provided such modifications come within the spirit and scope of the appended claims. Having now therefore fully illustrated and described my invention, what I claim to be new and desire to protect by Letters Patent is:

1. For a pair of diodes each having a terminal projecting from one end and the other end closed, a heat sink having parallel diode carrying portions, at least one of the diodes engaging and extending through one of said carrying portions and the other portion bearing against the closed end thereof, means for clamping these carrying portions together, and flange elements extending in diverging and radiating relationship from the said carrying portions for conducting heat away from each diode with equal effectiveness.

2. For mechanically supporting and also electrically connecting the electrode cases of a pair of diodes, a heat sink comprising a pair of metallic sections having webs spaced one from the other and flanges radiating from the edges of said webs, clamp means connecting said webs and operative to draw them toward each other, and means in said webs for receiving and extending each diode case through a respective web to bear against the other web as said clamp means is operated.

3. A heat sink for a pair of semi-conductor diodes having first electrodes forming cases with oppositely facing flat end portions and second electrodes respectively connected to terminals comprising a pair of metal sections having webs spaced one from the other, clamp bolts connecting said webs and operative to draw them toward each other, and separate means in said webs between said bolts for respectively receiving and holding the cases with each case respectively extending through the said means and their flat ends bearing in opposite directions on facing surfaces of the webs and whereby these flat ends will be pulled tight against the facing surfaces as said clamp bolts are tightened.

4. A heat sink for a pair of semi-conductor diodes having one pair of electrodes respectively with flat end portions and annular shoulders spaced axially therefrom, comprising a pair of metal channels having webs spaced one from the other and flanges extending from the opposite edges of said webs, clamp bolts connecting said webs and operative to draw them toward each other, and said webs having openings between said bolts for receiving the diodes and bearing against said annular shoulders while their flat ends also bear upon the webs and whereby these shoulders and flat ends will be pulled into tight engagement with the webs as said clamp bolts are tightened.

5. A heat sink for a pair of semi-conductor diodes having one pair of electrodes respectively with flat end portions and annular shoulders spaced axially therefrom, comprising a pair of metal channels having webs spaced one from the other and flanges extending from the opposite edges of said webs, clamp bolts connecting said webs and operative to draw them toward each other, said webs having openings between said bolts for receiving the diodes and bearing against said annular shoulders while their flat ends also bear upon the webs and whereby these shoulders and flat ends will be pulled into tight engagement with the webs as said clamp bolts are tightened, the flanges of said channels diverging and flaring apart to radiate and dissipate heat from both the shoulders and flat ends of the diodes.

6. A heat sink for a pair of semi-conductor diodes having one pair of electrodes respectively with flat end portions and annular shoulders spaced axially therefrom, comprising a pair of metal channels having webs spaced one from the other and flanges extending from the opposite edges of said webs, clamp bolts connecting said webs and operative to draw them toward each other, said webs having openings between said bolts for receiving the diodes and bearing against said annular shoulders while their flat ends also bear upon the webs and whereby these shoulders and flat ends will be pulled into tight engagement with the webs as said clamp bolts are tightened, the flanges of said channels diverging and flaring apart to radiate and dissipate heat from both the shoulders and flat ends of the diodes, one of said flanges of each channel being narrower than the other.

7. For supporting and electrically connecting the like electrodes of a pair of diodes as used in a full wave rectifier apparatus and said electrodes having threaded cases terminating in closed metallic ends, a heat sink comprising a pair of channel shaped metal sections having webs spaced one from the other and flanges extending from the edges of said webs, spaced clamp bolts connecting said webs and operative to draw them toward each other, said webs each having a tapped opening located between adjacent clamp bolts and into which the diodes are screwed whereby their threads and their closed ends will be pulled into tight engagement with the webs as said clamp bolts are tightened, and means for supporting the heat sink in said apparatus.

8. For supporting and electrically connecting the like electrodes of a pair of diodes as used in a full wave rectifier apparatus and said electrodes having threaded cases terminating in closed metallic ends, a heat sink comprising a pair of channel shaped metal sections having webs spaced one from the other and flanges extending from the edges of said webs, spaced clamp bolts connecting said webs and operative to draw them toward each other, said webs each having a tapped opening located between adjacent clamp bolts and into which the diodes are screwed whereby their threads and their closed ends will be pulled into tight engagement with the webs as said clamp bolts are tightened, and means for supporting the heat sink in said apparatus, said last mentioned means consisting of insulators secured to at least one flange of each channel.

9. For supporting and electrically connecting the like electrodes of a pair of diodes as used in a full wave rectifier apparatus and said electrodes having threaded cases terminating in closed metallic ends, a heat sink comprising a pair of channel shaped metal sections having webs spaced one from the other and flanges extending from the edges of said webs, spaced clamp bolts connecting said webs and operative to draw them toward each other, said webs each having a tapped opening located between adjacent clamp bolts and into which the diodes are screwed whereby their threads and their closed ends will be pulled into tight engagement with the webs as said clamp bolts are tightened, means for supporting the heat sink in said apparatus, said last mentioned means consisting of insulators secured to at least one flange of each channel, and a fan for blowing air in heat exchanging relation over the surfaces of the flanges and webs as well as the diodes themselves.

10. For supporting a semi-conductive unit having a closed end case and a terminal projecting from the other end, a heat sink having parallel spaced apart portions, clamp means connecting the portions for drawing them toward each other, and one portion having means for receiving said other end with the terminal projecting away therefrom and extending the case therethrough to bear the closed end thereof against the other portion as the portions are drawn toward each other such that heat as may be generated by the unit is transferred from both case ends to the respective portions.

11. For supporting and forming an electrical connection with a semi-conductive device having closed end case electrode and a terminal projecting from the case other end, a heat sink having parallel spaced-apart webs, one of the webs having means including an aperture for receiving the case other end for projecting the terminal away from the webs, clamp means connecting the webs for drawing them toward each other, and the aperture means being operative to extend the case closed end to bear against the other web as the clamp means are drawn toward each other for providing an engagement with the opposite ends of the case with the respective webs for transferring heat from the device into the webs in opposite direction.

References Cited in the file of this patent

UNITED STATES PATENTS

| | | |
|---|---|---|
| 2,730,663 | Harty | Jan. 10, 1956 |
| 2,815,472 | Jackson et al. | Dec. 3, 1957 |
| 2,820,929 | Coy | Jan. 21, 1958 |
| 2,820,930 | Coy et al. | Jan. 21, 1958 |
| 2,899,610 | Amstel | Aug. 11, 1959 |